(12) United States Patent
Huang (10) Patent No.: US 9,312,001 B1
(45) Date of Patent: Apr. 12, 2016

(54) WRITING AND VERIFYING CIRCUIT FOR A RESISTIVE MEMORY AND METHOD FOR WRITING AND VERIFYING A RESISTIVE MEMORY

(71) Applicant: Winbond Electronics Corp., Taichung (TW)

(72) Inventor: Koying Huang, San Jose, CA (US)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 14/623,507

(22) Filed: Feb. 17, 2015

(51) Int. Cl.
  *G11C 11/00* (2006.01)
  *G11C 13/00* (2006.01)

(52) U.S. Cl.
  CPC ........ G11C 13/0064 (2013.01); G11C 13/0069 (2013.01)

(58) Field of Classification Search
  USPC .................................................. 365/148, 163
  See application file for complete search history.

(56) References Cited

U.S. PATENT DOCUMENTS

| | | | | |
|---|---|---|---|---|
| 7,894,250 B2* | 2/2011 | Wang | ...................... | G11C 11/16 365/148 |
| 8,077,496 B2* | 12/2011 | Choi | ................... | G11C 11/5678 365/148 |
| 8,077,497 B2* | 12/2011 | Ogata | ................. | G11C 13/0007 365/148 |
| 8,116,117 B2* | 2/2012 | Cho | .......................... | G11C 7/04 365/148 |
| 8,599,600 B2* | 12/2013 | Xi | ....................... | G11C 11/5664 365/148 |
| 8,830,724 B2* | 9/2014 | Chang | ................. | G11C 13/0004 365/148 |
| 8,885,428 B2* | 11/2014 | Chen | ..................... | G11C 13/004 365/148 |
| 8,897,058 B2* | 11/2014 | Ahn | .................... | G11C 13/0064 365/148 |
| 8,917,535 B2* | 12/2014 | Lee | ..................... | G11C 13/0064 365/148 |
| 9,001,560 B2* | 4/2015 | Lee | ......................... | G11C 11/56 365/148 |
| 2008/0062740 A1 | 3/2008 | Baek et al. | | |

FOREIGN PATENT DOCUMENTS

WO      2013091564      6/2013

* cited by examiner

*Primary Examiner* — Trong Phan
(74) *Attorney, Agent, or Firm* — Jianq Chyun IP Office (57) ABSTRACT

A writing and verifying circuit and a method for writing and verifying a resistive memory thereof are provided. The steps of the method includes: enabling at least one word line signal corresponding to at least one selected resistive memory cell of the resistive memory during a writing and verifying timing period; providing a bit line voltage to the selected resistive memory cells, wherein the bit line voltage continuously increases or decreases from a first voltage level to a second voltage level during the writing and verifying timing period; and, measuring a detected current through the bit line and determining a finish time point of the writing and verifying timing period according to the detected current and a reference current.

17 Claims, 6 Drawing Sheets

FIG. 1 (RELATED ART)

```
┌─────────────────────────────────────────────────────┐
│ Enabling at least one word line signal corresponding│
│ to at least one selected resistive memory cell of the│─S210
│ resistive memory during a writing and verifying timing│
│ period                                              │
└─────────────────────────────────────────────────────┘
                          │
                          ▼
┌─────────────────────────────────────────────────────┐
│ Providing a bit line voltage to the selected resistive│
│ memory cell, wherein the bit line voltage continuously│─S220
│ increases or decreases from a first voltage level to a│
│ second voltage level during the writing and verifying│
│ timing period                                       │
└─────────────────────────────────────────────────────┘
                          │
                          ▼
┌─────────────────────────────────────────────────────┐
│ Measuring a detected current through a bit line of the│
│ selected resistive memory cell and determining a finish│
│ time point of the writing and verifying timing period│─S230
│ according to the detected current and a reference   │
│ current                                             │
└─────────────────────────────────────────────────────┘
```

WRITING AND VERIFYING CIRCUIT FOR A RESISTIVE MEMORY AND METHOD FOR WRITING AND VERIFYING A RESISTIVE MEMORY

BACKGROUND

1. Field of the Invention

The invention relates to a method for verifying a resistive memory and a verifying circuit for a resistive memory. Particularly, the invention relates to the method for writing and verifying the resistive memory by using a bit line voltage, and the bit line voltage continuously increases or decreases during a writing and verifying timing period.

2. Description of Related Art

Based on the demand for next-generation non-volatile memory, a kind of resistive random access memory (RRAM) have been developed. For getting the RRAM with better uniformity, a verifying operation with a good performance on the RRAM is necessary.

Figure 1:
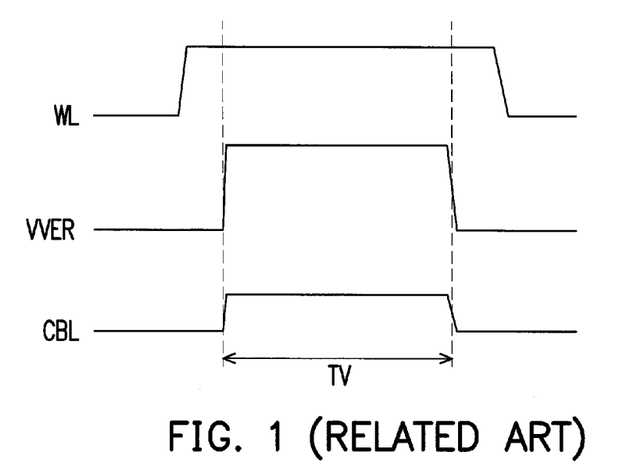
FIG. 1 illustrates a waveform plot for setting the RRAM in conventional art.

Referring to FIG. 1, FIG. 1 illustrates a waveform plot for setting the RRAM in conventional art. During a writing and verifying timing period TV, a word line signal WL is enabled (pulled to high voltage level), and a bit line voltage VVER is applied on a bit line of a selected resistive memory cell of the RRAM, and voltage level of the bit line voltage VVER is held on a constant voltage level during the writing and verifying timing period TV. In the conventional art, a bit line current CBL is detected during the writing and verifying timing period TV. By comparing the bit line current CBL with a target bit line current, whether the writing operation of the RRAM is finished or not can be determined. If the bit line current CBL does not reach to the target bit line current, the selected resistive memory cell should be set once more. If the bit line current CBL reaches to the target bit line current, the writing operation (set operation) on the selected resistive memory cell is completed.

That is, when the bit line voltage VVER is not well defined, the cycles of the writing and verifying timing period TV is hard to be controlled. Further, since the bias voltage for bit line voltage VVER is constant and the resistance is varied during the writing operation, the time of the writing operation may be too large. The performance of the writing operation for the RRAM is reduced.

SUMMARY OF THE INVENTION

The invention is directed to a method for writing and verifying a resistive memory and a writing and verifying circuit which can set and/or reset resistive memory cells effectively.

The invention provides a method for verifying a resistive memory, the method includes: enabling at least one word line signal corresponding to at least one selected resistive memory cell of the resistive memory during a writing and verifying timing period; providing a bit line voltage to the selected resistive memory cells, wherein the bit line voltage continuously increases or decreases from a first voltage level to a second voltage level during the writing and verifying timing period; and, measuring a detected current through the bit line and determining a finish time point of the writing and verifying timing period according to the detected current and a reference current.

The invention provides a writing and verifying circuit for a resistive memory. The writing and verifying circuit includes a current generator and at least one current detector. The current generator generates a reference current according to a bit line voltage, and generates a bias voltage according to the reference current, wherein the bit line voltage continuously increases or decreases from a first voltage level to a second voltage level during a writing and verifying timing period. The current detector is coupled to the reference current generator and a bit line of a selected resistive memory cell of the resistive memory. The current detector provides the bit line voltage to the selected resistive memory cell and generates a detect voltage according to a detected current on the bit line.

According to the above descriptions, in the invention, when the resistive memory cells are verified, a bit line voltage which increases or decreases continuously from a first voltage level to a second voltage level during the writing and verifying timing period is provided to the selected resistive memory cells. Moreover, by measuring a detected current through the bit line during the writing and verifying timing period, a finish time point of the writing and verifying timing period can be determined and the writing and verifying operation can be finished more precisely and efficiency.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 2:
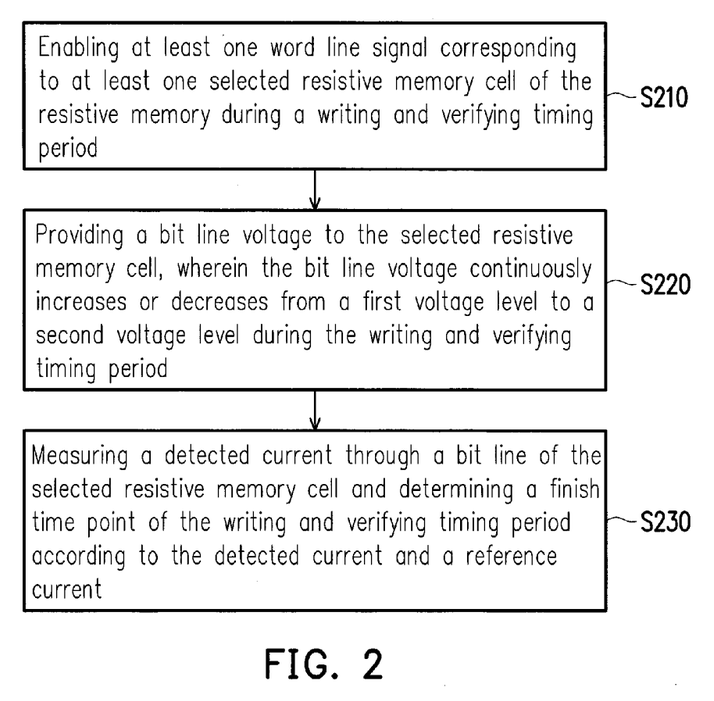
FIG. 2 is a flow chart for a method for writing and verifying a RRAM according to an embodiment of present application.

Referring to FIG. 2, FIG. 2 is a flow chart for a method for writing and verifying a RRAM according to an embodiment of present application. The method for writing and verifying the RRAM may be used for setting, resetting or forming one or more selected resistive memory cell(s) of the RRAM, and the selected resistive memory cell(s) can be verified simultaneously. In step S210, at least one word line signal is enabled during a writing and verifying timing period, and the at least one word line signal is corresponding to at least one selected resistive memory cell of the RRAM. In step S220, during the writing and verifying timing period, a bit line voltage is provided to a bit line of the selected resistive memory cell for the writing and verifying operation simultaneously. It should be noted here, the writing and verifying operation may be a setting operation, a resetting operation or a forming operation on the RRAM. Furthermore, a voltage level of the bit line voltage continuously increases or decreases from a first voltage level to a second voltage level during the writing and verifying timing period.

For example, when the setting operation is operated on the selected resistive memory cell, the voltage level of the bit line voltage continuously increases from the first voltage level to the second voltage level during the writing and verifying timing period, and the first voltage level is smaller than the second voltage level. On the other hand, when the resetting operation is operated on the selected resistive memory cell, the voltage level of the bit line voltage continuously decreases from the first voltage level to the second voltage level during the writing and verifying timing period, and the first voltage level is larger than the second voltage level.

In the step S230, during the writing and verifying timing period, a detected current through the bit line of the selected resistive memory cell is measured. The detected current may be used to compare with a reference current for determining a finish time point of the writing and verifying timing period. In detail, the reference current is generated according to the bit line voltage, and the detected current is used to be compared with the reference current. When a current level of the detected current reaches a current level of the reference current, the finish time point of the writing and verifying timing period can be determined, and the writing and verifying operation can be finished.

For example, when the setting operation is operated on the selected resistive memory cell, a source line voltage is applied on a source line of the selected resistive memory, and a voltage level of the source line voltage may be equal to the first voltage level (lower than the second voltage level). During the writing and verifying timing period, the bit line voltage increases from the first voltage level to the second voltage level, and the reference current increases according to the increasing of the bit line voltage. Also, since the bit line voltage applied on the bit line keeps on increasing, the current (detected current) on the bit line of the selected resistive memory cell increases accordingly. When the current level of the detected current is not smaller than the current level of the reference current, it means that the writing and verifying operation is finished, and the finish time point of the writing and verifying timing period can be determined.

For another example, when the resetting operation is operated on the selected resistive memory cell, a source line voltage is applied on a source line of the selected resistive memory, and a voltage level of the source line voltage may be equal to the first voltage level (higher than the second voltage level). During the writing and verifying timing period, the bit line voltage decreases from the first voltage level to the second voltage level, and the reference current decreases according to the increasing of the bit line voltage. Also, since the bit line voltage applied on the bit line keeps on decreasing, an absolute value of the current (detected current) on the bit line of the selected resistive memory cell increases accordingly, wherein a value of the current on the bit line is a negative value. When the current level of the detected current is smaller than the current level of the reference current, it means that the writing and verifying operation is finished, and the finish time point of the writing and verifying timing period can be determined.

Figure 3A:
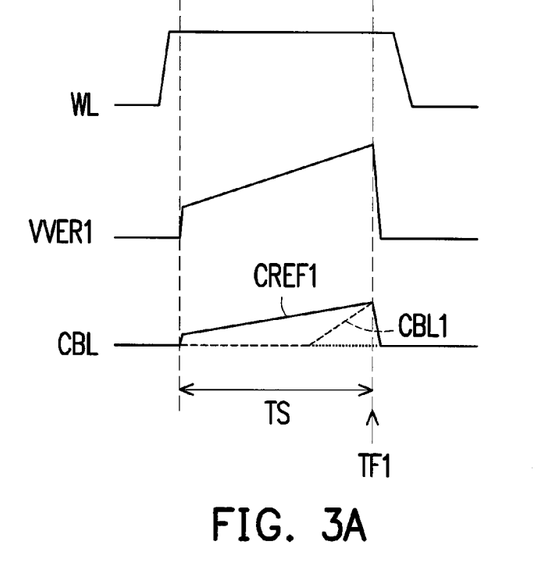
FIG. 3A illustrates a waveform plot of the setting operation on the RRAM according to an embodiment of present application.

Referring to FIG. 3A, FIG. 3A illustrates a waveform plot of the setting operation on the RRAM according to an embodiment of present application. In FIG. 3A, the word line signal WL is enabled (pulled to high voltage level) during the writing and verifying timing period TS. The voltage level of the bit line voltage VVER1 continuously increases during the writing and verifying timing period TS. Moreover, the reference current CREF increases during the writing and verifying timing period TS according to the variation of the bit line voltage VVER1. The detected current CBL1 increases according to the increasing of the bit line voltage VVER1, and a rising slope of the detected current CBL1 is larger than a rising slop of the reference current CREF1. At a timing point TF1, the current level of the detected current CBL1 reaches the current level of the reference current CREF1, and the timing point TF1 may be the finish time point of the writing and verifying timing period TS.

Figure 3B:
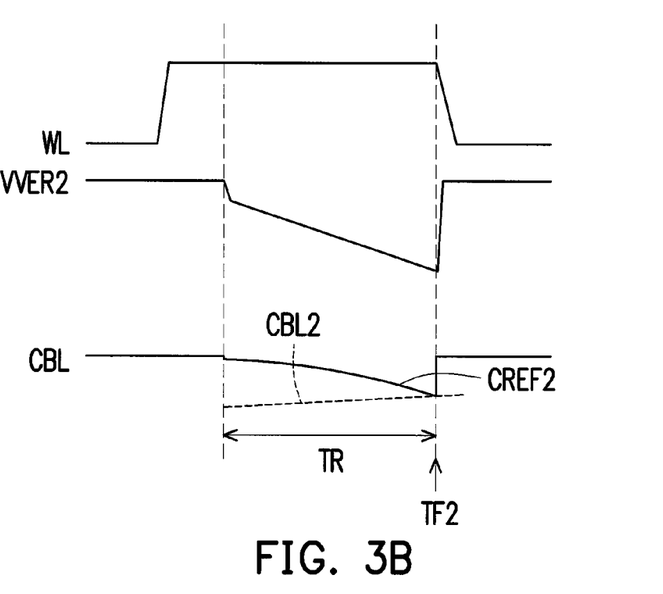
FIG. 3B illustrates a waveform plot of the resetting operation on the RRAM according to an embodiment of present application.

Referring to FIG. 3B, FIG. 3B illustrates a waveform plot of the resetting operation on the RRAM according to an embodiment of present application. In FIG. 3B, the word line signal WL is enabled (pulled to high voltage level) during the writing and verifying timing period TR. The voltage level of the bit line voltage VVER2 continuously decreases during the writing and verifying timing period TR. Moreover, the reference current CREF2 decreases during the writing and verifying timing period TR according to the variation of the bit line voltage VVER2. At a timing point TF2, the current level of the detected current CBL2 reaches the current level of the reference current CREF2, and the timing point TF2 may be the finish time point of the writing and verifying timing period TR.

It should be noted here, in FIG. 3A, the reference current CREF1 for the setting operation may increase linearly during the writing and verifying timing period TS. On the other hand, in FIG. 3B, an absolutely value of the reference current CREF2 for the resetting operation may be increased non-linearly during the writing and verifying timing period TR.

Figure 4:
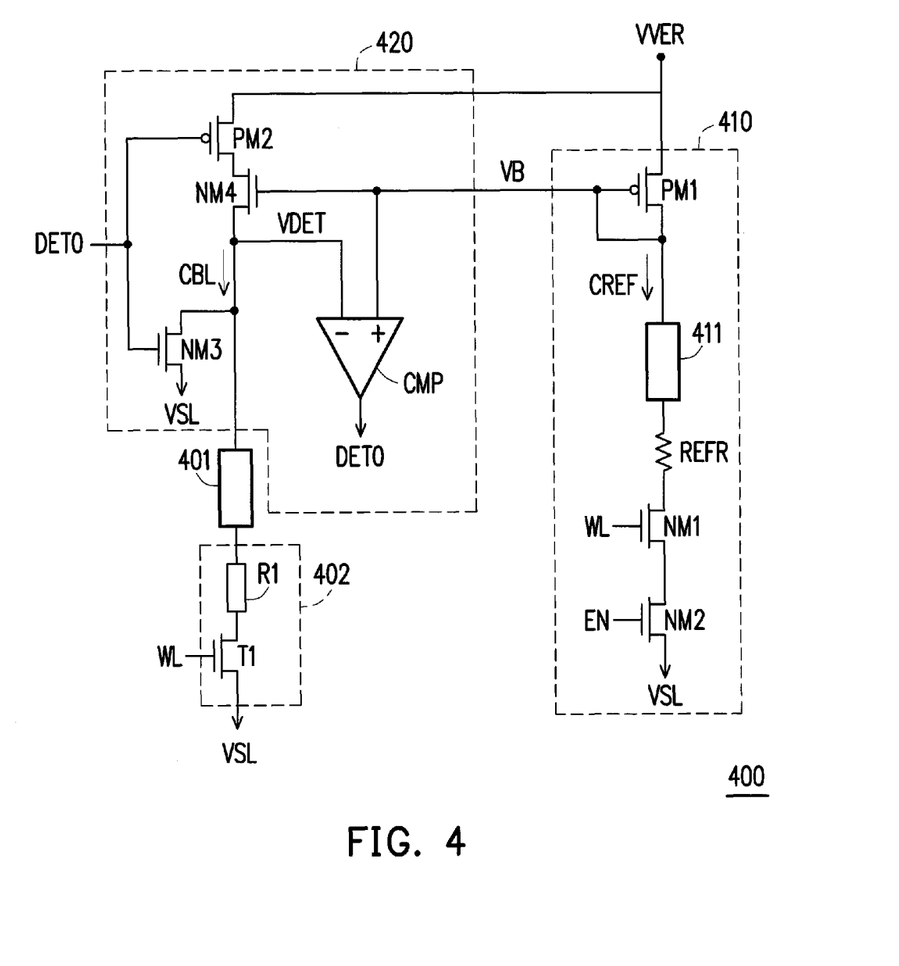
FIGS. 4-7 illustrates schematic diagrams of a plurality of writing and verifying circuits according to embodiments of present application.

Referring to FIG. 4, FIG. 4 illustrates a schematic diagram of a writing and verifying circuit according to an embodiment of present application. The writing and verifying circuit 400 is adapted for a resistive memory (RRAM) and used for setting and verifying the RRAM. The writing and verifying circuit 400 includes a current generator 410 and a current detector 420. The current generator 410 generates a reference current CREF according to a bit line voltage VVER, and generates a bias voltage VB according to the reference current CREF, wherein the bit line voltage VVER continuously increases from a first voltage level to a second voltage level during a verifying timing period. The current detector 420 is coupled to the current generator 410 and a bit line of a selected resistive memory cell 402, and the current detector 420 provides the bit line voltage VVER to the selected restive memory cell 402 and generates a detect voltage VDET according to a detected current CBL on the bit line.

In detail, the current generator 410 includes a transistor PM1, a dummy Y-path circuit 411, a reference resistor REFR and switches formed by transistors NM1 and NM2. A first end of the transistor PM1 receives the bit line voltage VVER, and a second of the transistor PM1 is coupled to a control end of the transistor PM1. The dummy Y-path circuit 411 is coupled between the second end of the transistor PM1 and the reference resistor REFR. The reference resistor REFR, transistors NM1 and NM2 are coupled between the dummy Y-path circuit 411 and a source line voltage VSL in series. The transistors NM1 and NM2 are respectively controlled by a word line signal WL and an enable signal EN.

During the writing and verifying timing period, the transistor PM1 receives the bit line voltage VVER when the transistors NM1 and NM2 are turned on, and the transistor PM1 generates the reference current CREF according to the bit line voltage VVER. Correspondingly, the transistor PM1 generates the bias voltage VB according to the reference current CREF. A current level of the reference current CREF may be determined according to a voltage level of the bit line voltage VVER and the resistance of the reference resistor REFR. In this embodiment, the current level of the reference current CREF=(VVER−Vth)/REFR, wherein the Vth is a threshold voltage of the transistor PM1. A circuit structure of the dummy Y-path decoder 411 may be as same as the Y-path circuit 401 corresponding to the selected resistive memory cell 402. Further, the enable signal EN is enabled (pulled to high level) during the writing and verifying timing period.

The current detector 420 includes a transistor PM3, comparator CMP, and switches formed by transistors PM2 and NM3. The transistors PM2, PM3 and NM3 are coupled in series between the bit line voltage VVER and the Y-path circuit 401. The transistors PM2 and NM3 are controlled by a detected output signal DETO for being turned on or cut off, and the on or off statuses of the transistors PM2 and NM3 are complementary. The transistor PM3 is controlled by the bias voltage VB and the transistors PM2 and PM3 form a path during the writing and verifying timing period for transporting the bit line voltage VVER to the Y-path circuit 401 corresponding to the resistive memory cell 402 when the transistor PM2 is turned on. During the writing and verifying timing period, a detected current CBL on the bit line of the resistive memory cell 402 can be detected, and the detect voltage VDET on the end which the transistors PM3 and NM3 coupled together can be obtained. The comparator CMP receives the bias voltage VB and the detect voltage VDET and compares the bias voltage VB and the voltage VDET to generate the detected output signal DETO. When the detected current CBL reaches to the reference current CREF, the voltage level of the detect voltage VDET reaches to the voltage level of the bias voltage VB, a finish time point of the writing and verifying timing period can be obtained, and the detected output signal DETO is varied for cutting of the transistor PM2 for finishing the writing and verifying operation.

In some embodiment, the enable signal EN may be tied to the detected output signal DETO.

On the other hand, the resistive memory cell 402 includes a resistor R1 and a transistor T1. The resistive memory cell 402 is a 1T1R resistive memory cell is an example for reference, and in some embodiments, the resistive memory cell 402 may formed by any other structure.

Figure 5:
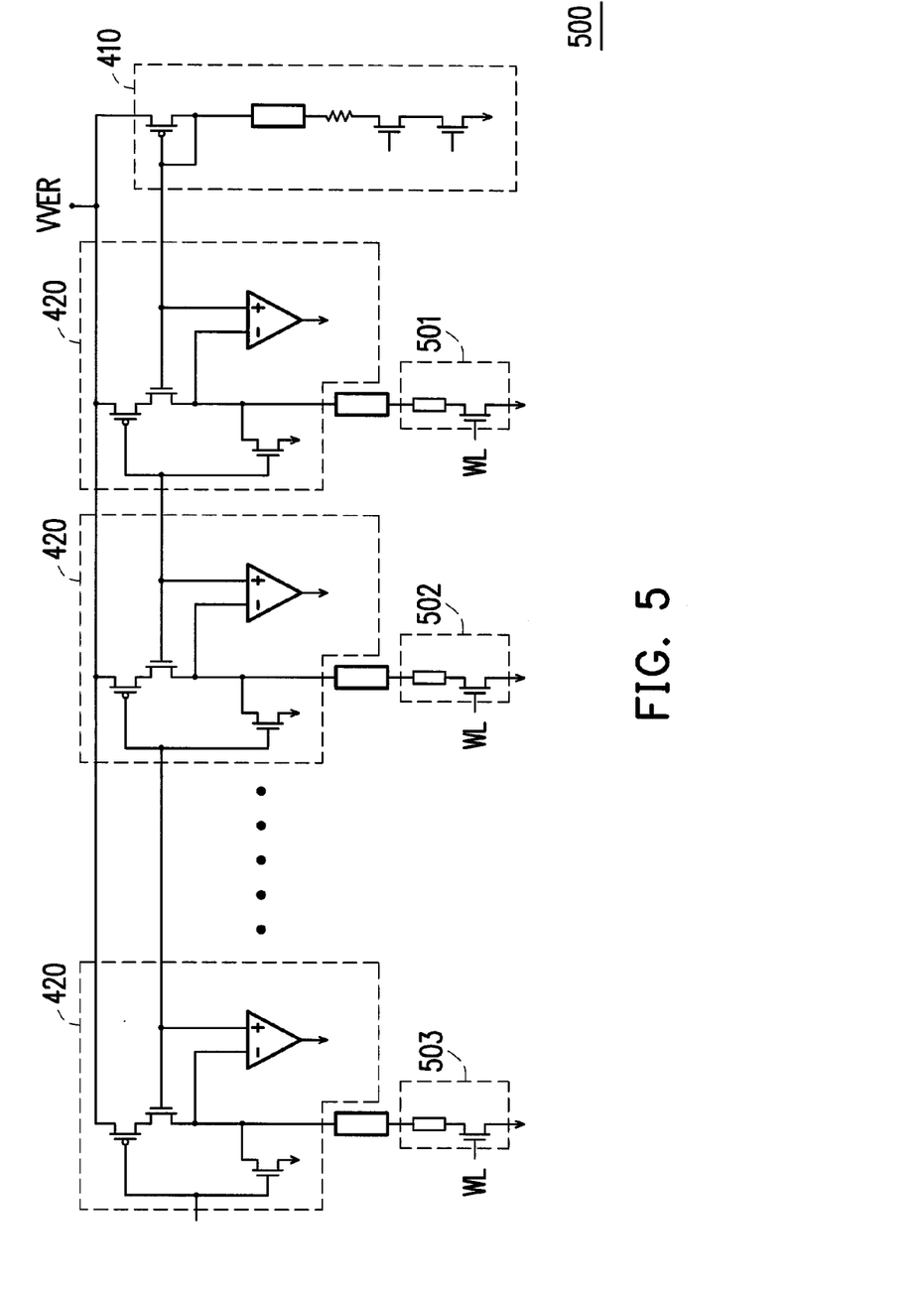

Referring to FIG. 5, FIG. 5 illustrates a schematic diagram of a writing and verifying circuit according to another embodiment of present application. The writing and verifying circuit 500 may be applied to a plurality of resistive memory cells 501-503. In FIG. 5, the writing and verifying circuit 500 includes one current generator 410 and a plurality of current detectors 420. The current detectors 420 are respectively coupled to the resistive memory cells 501-503 for writing and verifying a plurality of resistive memory cells 501-503 simultaneously. The resistive memory cells 501-503 may share the same word line signal WL.

Figure 6:
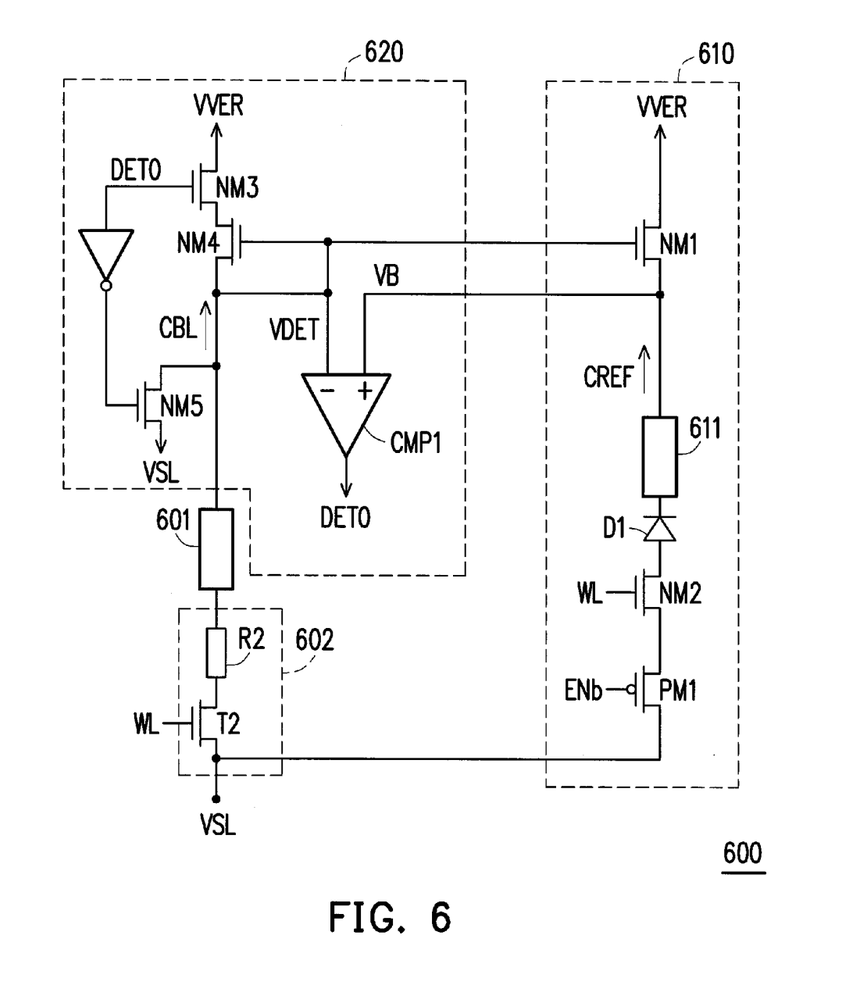

Referring to FIG. 6, FIG. 6 illustrates a schematic diagram of a writing and verifying circuit according to another embodiment of present application. The writing and verifying circuit 600 is adapted for the RRAM and used for resetting the RRAM. The writing and verifying circuit 600 includes a current generator 610 and a current detector 620. The current generator 610 generates a reference current CREF according to a bit line voltage VVER, and generates a bias voltage VB according to the reference current CREF, wherein the bit line voltage VVER continuously decreases from a first voltage level to a second voltage level during a verifying timing period. The current detector 620 is coupled to the current generator 610 and a bit line of a selected resistive memory cell 602, and the current detector 620 provides the bit line voltage VVER to the selected resistive memory cell 602 and generates a detect voltage VDET according to a detected current CBL on the bit line.

In detail, the current generator 610 includes a transistor NM1, a dummy Y-path circuit 611, a diode D1 and switches formed by transistors NM2 and PM3. A first end of the transistor NM1 receives the bit line voltage VVER, and a second end of the transistor NM1 is coupled to the comparator CMP. The dummy Y-path circuit 611 is coupled between the second end of the transistor NM1 and the diode D1. The diode D1, transistors NM2 and PM1 are coupled between the dummy Y-path circuit 611 and a source line voltage VSL in series. The transistors NM2 and PM1 are respectively controlled by a word line signal WL and an enable signal ENb. Wherein, the source line voltage VSL is at the initial of the writing and verifying timing period. The diode D1 is reverse biased between the dummy Y-path circuit 611 and the transistor NM2. That is, an anode of the diode D1 is coupled to the transistor NM2 and a cathode of the diode D1 is coupled to the dummy Y-path circuit 611.

During the writing and verifying timing period, the transistor NM1 receives the bit line voltage VVER when the transistors NM2 and PM1 are turned on, and the reference current CREF is generated according to the bit line voltage VVER and the source line voltage VSL. Correspondingly, the transistor NM1 generates the bias voltage VB according to the reference current CREF. A current level of the reference current CREF may be determined according to an electric characteristic of the diode D1. In this embodiment, the current level of the reference current $CREF=IS \times exp\,(VVER/Vth)$, wherein the Vth is a threshold voltage of the diode D1, and IS is a saturation current of the diode D1, exp is an operator of exponential. A circuit structure of the dummy Y-path decoder 611 may be as same as the Y-path circuit 601 corresponding to the selected resistive memory cell 602. Further, the enable signal ENb is enabled (pulled to low level) during the writing and verifying timing period.

The current detector 620 includes a transistor NM4, a comparator CMP1, and switches formed by transistors NM3 and NM5. The transistors NM3, NM4 and NM5 are coupled in series between the bit line voltage VVER and the Y-path circuit 601. The transistors NM3 and NM5 are controlled by a detected output signal DETO for being turned on or cut off, and the on or off statuses of the transistors NM3 and NM5 are complementary. The transistor PM3 is controlled by the bias voltage VB and the transistors NM3 and NM4 form a path during the writing and verifying timing period for transporting the bit line voltage VVER to the Y-path circuit 601 corresponding to the resistive memory cell 602 when the transistor NM3 is turned on. During the writing and verifying timing period, a detected current CBL on the bit line of the resistive memory cell 602 can be detected, and the detect voltage VDET on the end which the transistors NM4 and NM5 coupled together can be obtained. The comparator CMP1 receives the bias voltage VB and the detect voltage VDET and compares the bias voltage VB and the detect voltage VDET to generate the detected output signal DETO. When the detected current CBL reaches to the reference current CREF, the voltage level of the voltage VDET reaches to the voltage level of the bias voltage VB, a finish time point of the writing and verifying timing period can be obtained, and the detected output signal DETO is varied for cutting of the transistor NM3 for finishing the writing and verifying operation.

On the other hand, the resistive memory cell 602 includes a resistor R2 and a transistor T2. The resistive memory cell 602 is a 1T1R resistive memory cell as an example for reference, and in some embodiments, the resistive memory cell 602 may be formed by any other structure.

Figure 7:
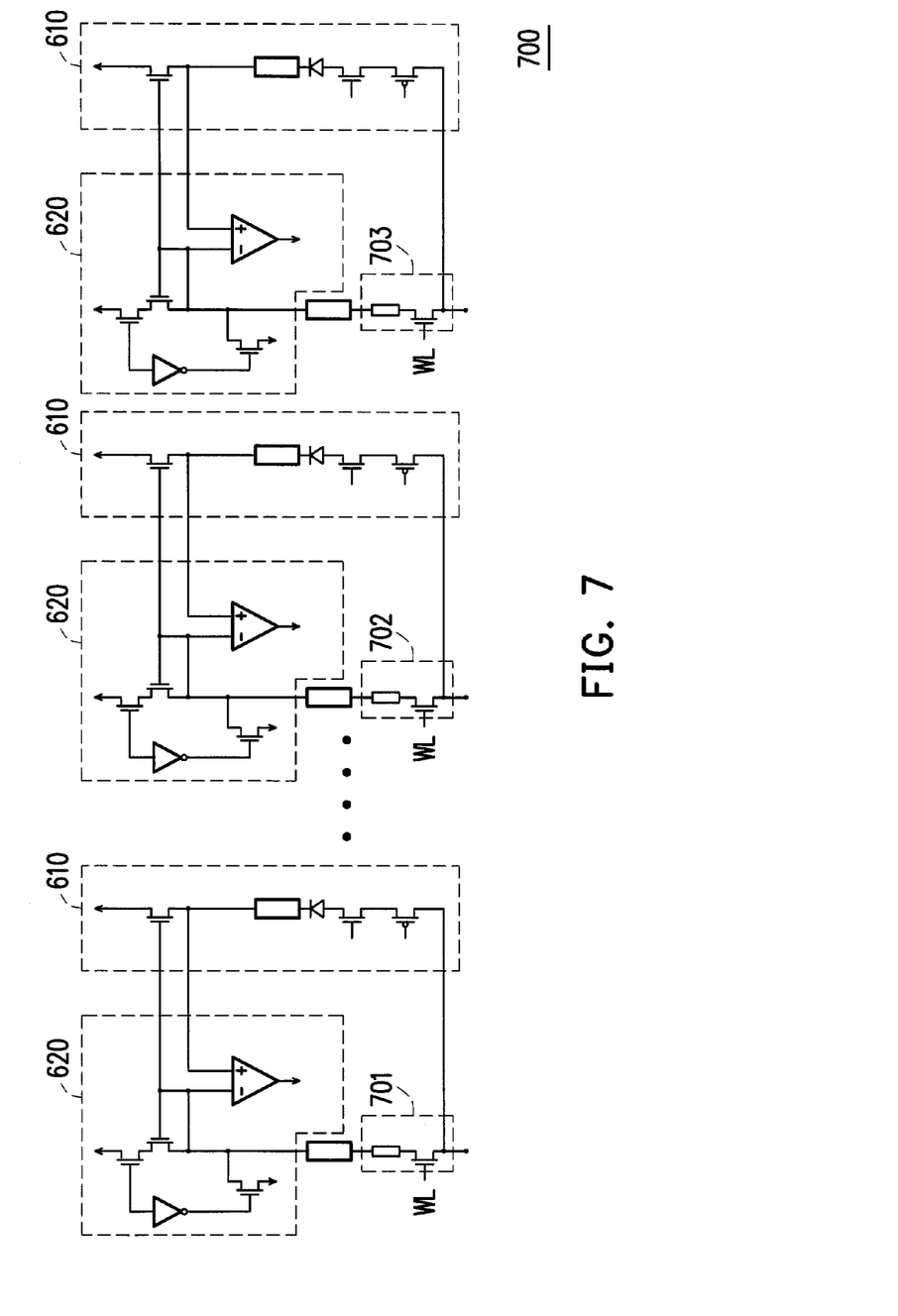

Referring to FIG. 7, FIG. 7 illustrates a schematic diagram of a verifying circuit according to another embodiment of present application. In FIG. 7, each of the resistive memory cell 701-703 corresponding to one current generator 610 and one current detector 620. The current detectors 620 are respectively coupled to the resistive memory cells 701-703 for writing and verifying a plurality of resistive memory cells 501-503 simultaneously, and each of the current detectors 620 is coupled to corresponding current generator 710. The resistive memory cells 701-703 may share the same word line signal WL.

In summary, the bit line voltage applied to the bit line of the selected resistive memory cell is continuously varied during the writing and verifying timing period. By detecting the detected current on the bit line, the finish time point of the writing and verifying timing period can be obtained efficiency, and the performance of the writing and verifying operation on the RRAM can be improved.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A writing and verifying circuit for a resistive memory, comprising:
   a current generator, generating a current according to a bit line voltage, and generating a bias voltage according to the reference current, wherein the bit line voltage continuously increases or decreases from a first voltage level to a second voltage level during a writing and verifying timing period; and
   at least one current detector, coupled to the reference current generator and a bit line of a selected resistive memory cell of the resistive memory, providing the bit line voltage to the selected resistive memory cell and generating a detected voltage according to a detected current on the bit line,
   wherein, the at least one current detector determining a finish time point of the writing and verifying timing period by comparing the detect voltage and the bias voltage.

2. The writing and verifying circuit for a resistive memory according to claim 1, wherein the current generator comprises:
   a first transistor, having a first end, a second end and a control end, wherein the first end of the first transistor receives the bit line voltage, the second end of the first transistor is coupled to the control end of the first transistor, and the bias voltage is generated on the control end of the first transistor;
   a dummy Y-path circuit, coupled to the second end of the first transistor;
   a reference resistor, having a first end being coupled to the dummy Y-path circuit;
   a first switch, coupled to a second end of the reference resistor, and controlled by a word line signal for being turned on or cut off; and
   a second switch, coupled between the first switch and a source line voltage; and controlled by an enable signal for being turned on or cut off.

3. The writing and verifying circuit for a resistive memory according to claim 2, wherein the at least one current detector comprises:
   a third switch, having a first end receiving the bit line voltage, and being controlled by a detected output signal for being turned on or cut off;
   a second transistor, having a first end, a second send and a control end, wherein the first end of the second transistor is coupled to a second end of the third switch, the control end of the second transistor is coupled to the control end of the first transistor, and the second end of the second transistor is coupled to a Y-path circuit corresponding to the selected resistive memory cell;
   a fourth switch, coupled between the second end of the second transistor and the source line voltage, and being controlled by the detected output signal; and
   a comparator, having a first input end and a second input end for respectively receiving the bias voltage and a voltage on the second end of the second transistor, and generating the detected output signal.

4. The writing and verifying circuit for a resistive memory according to claim 2, wherein the reference current is generated according to the bit line voltage and a resistance of the reference resistor.

5. The writing and verifying circuit for a resistive memory according to claim 1, wherein the current generator comprises:
   a first transistor, having a first end, a second end and a control end, wherein the first end of the first transistor receives the bit line voltage, the control end of the first transistor is coupled to the at least one current detector, and the bias voltage is generated on the second end of the first transistor;
   a dummy Y-path circuit, coupled to the second end of the first transistor;
   a diode, having a cathode being coupled to the dummy Y-path circuit;
   a first switch, coupled to an anode of the diode, and controlled by a word line signal for being turned on or cut off; and
   a second switch, coupled between the first switch and a source line voltage; and controlled by an enable signal for being turned on or cut off.

6. The writing and verifying circuit for a resistive memory according to claim 5, wherein the at least one current detector comprises:
   a third switch, having a first end receiving the bit line voltage, and being controlled by a detected output signal for being turned on or cut off;
   a second transistor, having a first end, a second end and a control end, wherein the first end of the second transistor is coupled to a second end of the third switch, the control end of the second transistor is coupled to the control end of the first transistor, and the second end of the second transistor is coupled to a Y-path circuit corresponding to the selected resistive memory cell and the control end of the second transistor;
   a fourth switch, coupled between the second end of the second transistor and the source line voltage, and being controlled by the detected output signal; and
   a comparator, having a first input end and a second input end for respectively receiving the bias voltage and a voltage on the second end of the second transistor, and generating the detected output signal.

7. The writing and verifying circuit for a resistive memory according to claim 1, wherein if the first voltage level being larger than the second voltage level, the bit line voltage continuously decreasing from the first voltage level to the second voltage level during the writing and verifying timing period.

8. The writing and verifying circuit for a resistive memory according to claim 7, wherein the reference current decreases non-linearly for resetting the selected resistive memory cell.

9. The writing and verifying circuit for a resistive memory according to claim 1, wherein if the first voltage level being smaller than the second voltage level, the bit line voltage continuously increasing from the first voltage level to the second voltage level during the writing and verifying timing period.

10. The writing and verifying circuit for a resistive memory according to claim 9, wherein the reference current increases linearly for setting the selected resistive memory cell.

11. A method for writing and verifying a resistive memory, comprising:
enabling at least one word line signal corresponding to at least one selected resistive memory cell of the resistive memory during a writing and verifying timing period;
providing a bit line voltage to the selected resistive memory cell, wherein the bit line voltage continuously increases or decreases from a first voltage level to a second voltage level during the writing and verifying timing period; and
measuring a detected current through a bit line of the selected resistive memory cell and determining a finish time point of the writing and verifying timing period according to the detected current and a reference current.

12. The method for writing and verifying a resistive memory according to claim 11, wherein the step of providing the bit line voltage to the selected resistive memory cell comprises:
if the first voltage level being larger than the second voltage level, the bit line voltage continuously decreasing from the first voltage level to the second voltage level during the writing and verifying timing period.

13. The method for writing and verifying a resistive memory according to claim 12, wherein the reference current decreases non-linearly for resetting the selected resistive memory cell.

14. The method for writing and verifying a resistive memory according to claim 11, wherein the step of providing the bit line voltage to the selected resistive memory cell comprises:
if the first voltage level being smaller than the second voltage level, the bit line voltage continuously increasing from the first voltage level to the second voltage level during the writing and verifying timing period.

15. The method for writing and verifying a resistive memory according to claim 14, wherein the reference current increases linearly for setting the selected resistive memory cells.

16. The method for writing and verifying a resistive memory according to claim 11, wherein the step of determining the finish time point of the writing and verifying timing period according to the detected current and the reference current comprises:
comparing the detected current and the reference current to determine the finish time point of the writing and verifying timing period.

17. The method for writing and verifying a resistive memory according to claim 16, wherein the reference current is varied according to a variation of the bit line voltage.

\* \* \* \* \*